US 6,611,046 B2

(12) United States Patent
Yang

(10) Patent No.: US 6,611,046 B2
(45) Date of Patent: Aug. 26, 2003

(54) FLEXIBLE POLYIMIDE CIRCUITS HAVING PREDETERMINED VIA ANGLES

(75) Inventor: Rui Yang, Austin, TX (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 09/874,647

(22) Filed: Jun. 5, 2001

(65) Prior Publication Data

US 2003/0001237 A1 Jan. 2, 2003

(51) Int. Cl.[7] ............................................... H01L 29/06
(52) U.S. Cl. ...................... 257/622; 257/701; 257/774
(58) Field of Search ......................... 174/254; 257/622, 257/701, 774; 437/187, 192, 228

(56) References Cited

U.S. PATENT DOCUMENTS

| | | | |
|---|---|---|---|
| 3,801,368 A | 4/1974 | Fusayama et al. | ......... 117/239 |
| 4,447,593 A | 5/1984 | Funakoshi et al. | ......... 528/176 |
| 4,960,539 A | 10/1990 | Kuhn et al. | ......... 252/299.5 |
| 5,209,819 A | 5/1993 | Suzuki et al. | ......... 156/656 |
| 5,219,787 A * | 6/1993 | Carey et al. | ......... 438/637 |
| 5,378,314 A | 1/1995 | Schmidt et al. | |
| 5,470,693 A * | 11/1995 | Sachdev et al. | ......... 430/315 |
| 6,060,175 A | 5/2000 | Swisher | ......... 428/612 |
| 6,211,468 B1 * | 4/2001 | Windschitl | ......... 174/254 |
| 6,343,171 B1 * | 1/2002 | Yoshimura et al. | ......... 385/50 |

FOREIGN PATENT DOCUMENTS

| | | | |
|---|---|---|---|
| EP | 0 402 028 B1 | 2/1995 | ......... H05K/3/02 |
| EP | 0 407 129 B1 | 5/1996 | ......... H05K/3/02 |
| EP | 0 214 827 B2 | 1/1998 | ......... C08J/7/04 |
| EP | 0 951 206 A2 | 10/1999 | ......... H05K/3/46 |
| EP | 0 961 206 A2 | 12/1999 | ......... G06F/13/40 |
| EP | 1 027 995 A1 | 8/2000 | ......... B41J/2/175 |
| EP | 1 044 800 A1 | 10/2000 | ......... B32B/15/08 |
| JP | 9-100359 | 9/1997 | ......... C08J/7/00 |
| JP | WO 00/11066 * | 3/2000 | |
| WO | WO 99/39021 | 8/1999 | ......... C23C/14/20 |
| WO | WO 00/11066 | 3/2000 | ......... C08J/5/18 |

OTHER PUBLICATIONS

"Copper Adhesion to Liquid Crystal Polymer and Other Film–Based Circuit Substrates," Michael St. Lawrence et al, *1999 International Symposium on Microelectronics*, (Rogers Corporation), pp. 354–360.

"Effect of Copper Lamination on the Rheological and Copper Adhesion Properties of a Thermotropic Liquid Crystalline Polymer Used in PCB Applications," Cynthia G.L. Khoo et al, *IEEE Transactions on components, Packaging, and Manufacturing Technology*—Part C, (IEEE) vol. 20, No. 3, Jul. 1997, pp. 219–226.

"Combined Laser Processing of Vias and Circuitry in Flex–Circuits", IBM Technical Disclosure Bulletin, pp. 607–08, vol. 38, No. 5 (May 1, 1995); IBM, New York, U.S.A.

* cited by examiner

*Primary Examiner*—David Nelms
*Assistant Examiner*—Dao H. Nguyen
(74) *Attorney, Agent, or Firm*—Melanie G. Gover; Darla P. Fonseca

(57) ABSTRACT

A flexible circuit having a polyimide substrate containing at least one chemically etched feature, wherein such etched feature has sidewalls having a predetermined slope angle. It is possible to create etched features having predetermined slopes of from about 10 to about 70 degrees. Preferably, the flexible circuit was formed from a polyamic acid containing multiple ester groups in its main polymer chain.

17 Claims, 2 Drawing Sheets

FLEXIBLE POLYIMIDE CIRCUITS HAVING PREDETERMINED VIA ANGLES

BACKGROUND

The disclosures herein relate generally to flexible circuits and more particularly to flexible circuits having vias with predetermined sidewall angles.

Polyimide film is commonly used as a substrate for flexible circuits. Patterning such substrates primarily is accomplished by such process steps as mechanical punching or drilling, laser ablation and chemical etching. Etched features such as vias or throughholes are commonly present in flexible circuits for reasons of interconnection.

WO 00/11066 discloses polyimide films formed from polyamic acids obtained upon the reaction of p-phenylene bis(trimellitic acid monoester anhydride), hydroxydiphthalic dianhydride, p-phenylenediamine and 4,4'-diaminodiphenyl ether in an organic solvent. The film has a high modulus, high elongation and low coefficients of linear expansion and expansion due to moisture absorption.

The sidewalls of the features show different slopes depending on whether physical or chemical methods are used for forming the feature. For example, punching or drilling basically provides parallel sidewalls. Laser ablation can provide specific slopes, however it is extremely expensive to perform. Chemical etching provides features with angled sidewall slopes. For example, the sidewall slope of a popular commercial polyimide, Kapton™, is from about 20–30 degrees when chemically etched, using a photoresist mask. However, it is extremely difficult to control or alter the angle when chemically etching with a photoresist mask due to a variety of issues, including uncontrolled swelling of the polyimide. Surface treatments such as corona and plasma etching have also be used to etch polyimides, and to achieve shallow angles. However, surface treatments have not been successful at producing angles in the polyimide above about 15%.

Depending on the applications, significantly different polyimide via slope angles from that normally obtained by chemical etching would be desirable. For example, a shallow angle may be desirable if more stiffness is needed or if the etch feature must interface with another part. Alternatively, a steep via angle may be desirable if the trace density is high or more flexibility of the circuit is desired.

It has now been discovered that flexible circuits having substrates formed from certain polyimide substrates may be chemically etched by controlled means to form an etched feature having a sidewall of a predetermined slope.

Further, flexible circuits may be formed wherein the substrate has been chemically etched by controlled means such that there are multiple etched features having sidewalls of differing predetermined slopes.

Also, flexible circuits formed from such polyimide substrates do not show the uncontrolled swelling when such an etch is attempted as has been observed with conventional polyimide substrates.

Flexible circuits may also be formed where one etched feature has at least one sidewall having two differing slopes.

SUMMARY OF THE INVENTION

The instant invention provides a flexible circuit having a polyimide substrate containing at least one chemically etched feature, wherein such etched feature has sidewalls having a predetermined slope angle.

The instant invention further provides a process for forming a flexible circuit having a polyimide substrate and containing at least one chemically etched feature, wherein such etched feature has sidewalls with a predetermined slope angle.

More specifically, the instant invention provides a flexible circuit having a polyimide substrate comprising at least one chemically etched feature with sidewalls that have a preselected slope angle of from about 15 degrees to about 75 degrees.

The invention further provides a flexible circuit having a polyimide substrate comprising at least a first and a second chemically etched features having one or more sidewalls of predetermined slopes, wherein said first feature has a predetermined slope which differs from the predetermined slope of the second feature. More features may be included in the plurality which have the same or differing predetermined sidewall slopes as the first and second feature.

Flexible circuits may also be formed where one etched feature has a first sidewall and a second sidewall, each sidewall having a different predetermined slope.

The polyimide substrate of flexible circuit of the invention comprises a polyimide formed from at least one polyamic acid having an ester group therein. One useful monomer is p-phenylene bis(trimellitic acid monoester anhydride) monomer (TMHQ). Other useful monomers include 1,3-diphenol bis(anhydro-trimellitate), 1,4-diphenol bis(anhydro-trimellitate), ethylene glycol bis(anhydro-trimellitate), biphenol bis(anhydro-trimellitate), oxy-diphenol bis(anhydro-trimellitate), bis(4-hydroxyphenyl sulfide) bis(anhydro-trimellitate), bis(4-hydroxybenzophenone) bis(anhydro-trimellitate), bis(4-hydroxyphenyl sulfone) bis(anhydro-trimellitate), bis (hydroxyphenoxybenzene), bis(anhydro-trimellitate), 1,3-diphenol bis(aminobenzoate), 1,4-diphenol bis (aminobenzoate), ethylene glycol bis(aminobenzoate), biphenol bis(aminobenzoate), oxy-diphenol bis (aminobenzoate), bis(4 aminobenzoate) bis (aminobenzoate), and the like.

When other types of polyimides are etched, they provide the same slope each time they are etched, and it is not possible to vary the slope, or predetermine a desirable slope. Further, the polyimides conventionally used in electronic packaging are very subject to swelling during etching, which renders control of the etch depth and angle difficult at best. Preferred substrates useful in circuits of the invention do not swell more than about fifty percent (50%) by volume when subjected to chemical etchants commonly used to etch flexible circuits.

The invention also provides a process for forming a flexible circuit having a polyimide substrate containing at least one chemically etched feature thereon, wherein such etched feature has sidewalls with a predetermined slope angle.

As used herein, these terms have the following meanings.

1. The terms "etched feature" and "chemically etched feature" are synonymous and mean an indentation, via, hole, or the like, which is formed in one or more layers of the flexible circuit by means of etching at least a portion of at least one layer in a chemical bath.

2. The term "sidewalls" refers to the sides of an indentation or hole feature formed by the etching of one or more layers of the substrate. It should be noted that the number of sidewalls varies with the geometry of the etched feature. For example, a circular etched feature has only one sidewall, which may have one or more slope angles. A square will have four sidewalls, which may each have one or more slope angles.

3. The term "slope angle" refers to that angle measured from the bottom of the feature to the top of the etched feature.

All percentages, ratios and amounts herein are by weight unless otherwise specifically noted.

DETAILED DESCRIPTION OF THE INVENTION

Figure 1:
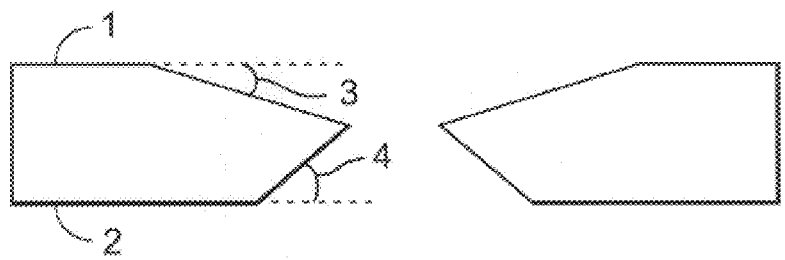
FIG. 1 is a side representation of an etched feature having at least one sidewall having multiple preselected slope angles.

The polyimide film used in the process of the invention is produced from a polyamic acid obtained upon the reaction of a p-phenylene bis(trimellitic acid monoester anhydride), hydroxydiphthalic dianhydride, p-phenylenediamine, and 4,4"-diaminodiphenyl ether in an organic solvent. The polyimide films are produced from polyamic acid prepared by common synthesis methods.

Examples of acid anhydrides which may be used to synthesize polyamic acid to form films useful in circuits and processes of the invention include those having at least one ester chain in the main polymer chain, or "backbone". Useful polyamic acids contain at least about 25% ester groups. One example is TMHQ, which has the following structure:

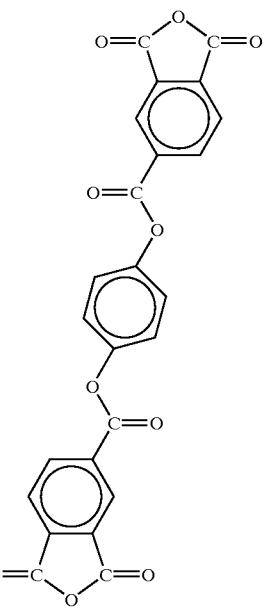

Other monomers include PDA, ODA, pyromellitic dianhydride (PMDA), and the like. These types of monomers are available commercially in Kapton®, Apical®, and the like. The sequence in which the monomers are added for the synthesis is not limiting; however, at least one of the monomers must have an ester group. The total molar amount of the diamine compounds and total molar amount of the acid anhydrides are generally equivalent, having a ratio of from about 0.95:1.05 to about 1.05:0.95. An exact 1:1 ratio should be avoided as this may cause such a complete polarization that an accompanying excessively high viscosity will result.

Organic solvents useful in the polymerization process of the polyimide film include such solvents as N,N-dimethyl formamide, N,N-dimethyl acetamide and similar amides, pyrrolidones such as N-methyl-2-pyrrolidone, and phenols such as p-chlorophenol and cresol. Such solvents may be used alone or may have small amounts of solvents which poorly dissolve polyamic acids such as toluene, tetrahydrofuran, acetone, methylethyl ketone, methanol and ethanol, to adjust to the desired degree of solubility.

The solution can be formed into a film during imidization. In general, the imidization can be either a thermal imidization or a method using a dehydration agent and/or a catalyst. Useful dehydration agents include aromatic acid anhydrides and aliphatic acid anhydrides such as acetic anhydride. Examples of catalysts useful in the imidization include pyridine, α-picoline, β-picoline, trimethylamine, dimethylaniline, triethylamine, isoquinoline and similar tertiary amines.

The final polyimide film may also include additives such as agents to prevent thermal deterioration, salts, fillers and the like in such amounts as will not substantially change the primary properties. Examples include triphenyl phosphate and benzophenones. The polyimide film is then used to form a flexible circuit.

Another factor in the process of obtaining a feature with a predetermined slope is to vary the concentration of the chemical etchant used, e.g., a concentrated alkali metal hydroxide solution, in the process, the temperature thereof, and the pressure under which the film is etched. Useful etchants are concentrated bases which are water soluble including, but not limited to, potassium hydroxide, sodium hydroxide, and cesium hydroxide. Bases with low water solubility such as lithium hydroxide, aluminum hydroxide, and calcium hydroxide are not useful in processes of the invention as the solution becomes saturated prior to reaching useful concentrations. Concentration of the etchant ranges from about 30% to about 55%, preferably from about 40% to about 50%. The etching step of the process of the present invention is accomplished by contacting unmasked areas of the polymeric film with the concentrated base etchant.

The time for etching depends upon the type and thickness of the film to be etched and is typically from about 10 seconds to about 20 minutes. When the preferred etchant, concentrated KOH, is used, the etching time for a 50 micrometer (2 mil) polyimide film is from about 30 seconds to about 180 seconds. The etching solution is generally at a temperature of from about 50° C. (122° F.) to about 120° C. (250° F.).

Another variant, as mentioned above, is to use surface treatments, such as plasma treatments and/or corona treatments in order to alter the slope of the angle. The surface treatment also helps to improve the integrity of the via. Interface adhesion between the resist and substrate is an important factor during chemical etching. Any surface contamination, defects, or imperfections such as scratches will influence edge definition of etched features. Surface treatments such as plasma can clean contamination and repair some of the surface defects by essentially performing a very fine etching on the surface of the substrate. The selection of the type of gas plasma, e.g., oxygen plasma, nitrogen plasma, and the like is important not only for the characteristic of the gas plasma, but because the polymer surface may also chemically interact with some gases, e.g., air or nitrogen, to alter and improve the surface chemical uniformity, and increase the surface wetability during the chemical etching process.

In FIG. 1, for example, one surface, 1 of the flexible circuit was pretreated. This creates a via having a sidewall with a shallow angle slope, 3 while the second surface 2 which received no surface treatment when etched yielded a sidewall having a steeper slope angle 4.

Figure 2:
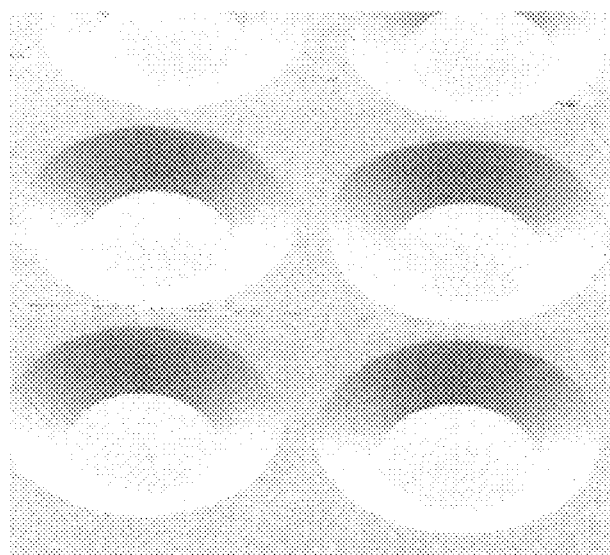
FIG. 2 is a photograph of an etched feature on a substrate with a corona surface treatment after etching. The sidewall slope angle is 25 degrees.

FIG. 2 is a photograph of an etched flexible circuit of the invention having an etched feature where the flexible was subjected to a surface treatment. Smooth side angles were obtained.

Figure 3:
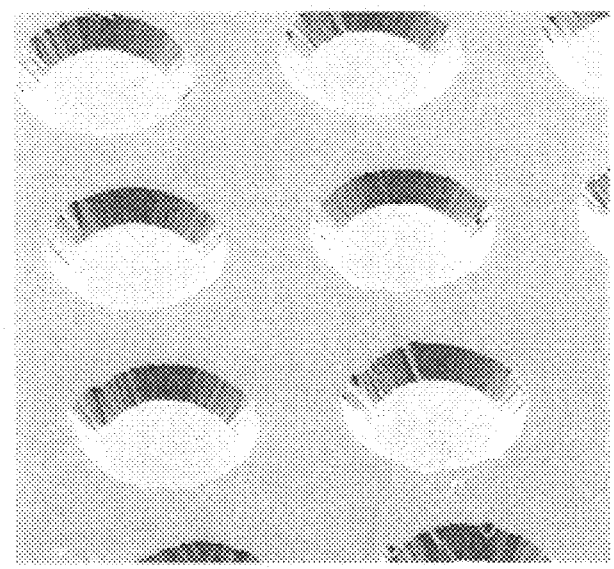
FIG. 3 is photograph of an etched feature on a substrate with no surface treatment after etching. The sidewall slope angle is 43 degrees. The etched vias without the surface pre-treatment have sidewalls which are somewhat rough and the via edge is jagged.

FIG. 3 is a photograph of an etched flexible circuit which was etched according to the same process conditions as the etched circuit in FIG. 2, except that no type of surface treatment was performed before the etch step. As can be seen, the etched vias without the surface pre-treatment have sidewalls which are somewhat rough and the via edge is jagged. The surface treatment used in the etch of FIG. 2 has not only changed the angle but improved the smoothness of the etched surface.

Figure 4:
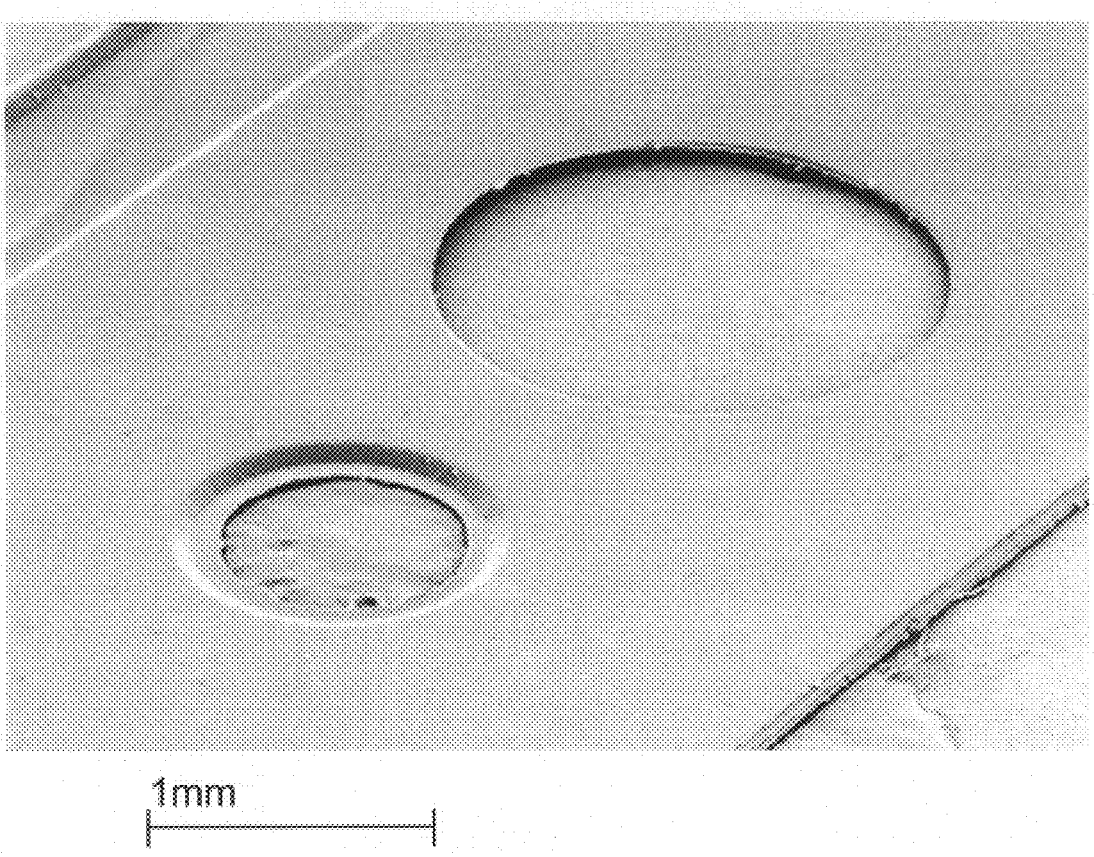
FIG. 4 is a photograph of a two etched features on a substrate, where one feature has a sidewall slope angle different from the sidewall slope angle of the second feature.

FIG. 4 is a photograph of two etched features on a substrate, where one feature has a sidewall slope angle different from the sidewall slope angle of the second feature. One feature has sidewall slope angles of about 23°; this feature was etched after surface plasma treatment. The other feature has sidewall slope angles of about 49°. This feature was etched without surface pre-treatment. Both features were etched at same condition of 45% KOH concentration and about 128° C. (200° F.) etchant temperature.

In the process for producing the flexible circuit with a polyimide substrate, the sequence of procedures may be varied as desired for the particular application.

A typical sequence of steps may be described as follows:

The aqueous processible photoresists are laminated onto both sides of a clean substrate having a polymeric film side and a copper side, using standard laminating techniques. Typically, the substrate consists of a polymeric film layer of from about 25 micrometers to about 125 micrometers, with the copper layer being from about 1 to about 5 micrometers thick. The substrate may be made by various methods such as adhesively bonding a polyimide layer onto copper foil, coating liquid polyimide on copper foil or the like.

The thickness of the photoresist is from about 35 to about 50 micrometers. The photoresist is then exposed on both sides to ultraviolet light or the like, through a mask, crosslinking the exposed portions of the resist. The resist is then developed with a dilute aqueous solution, e.g., a 0.5–1.5% carbonate solution, until desired patterns are obtained on both sides of the laminate. The copper side of the laminate is then further plated to desired thickness. The laminate is then placed into a bath of concentrated base at a temperature of from about 50° C. to about 120° C. which etches the portions of the polymeric film not covered by the crosslinked resist. This exposes certain areas of the original thin copper layer. The resist is then stripped off both sides of the laminate in a 2–5% solution of an alkaline metal hydroxide at from about 20° C. to about 80° C., preferably from about 20° C. to about 60° C. Subsequently, the original thin copper layer is etched where exposed with an etchant which does not harm the polymeric film, e.g., Perma-etch™, available from Electrochemicals, Inc.

The surface treatment, e.g., plasma or corona treatments, when desirable, can be performed at either of two different times. It may be done after initial cleaning of the substrate, prior to the resist being laminated onto the substrate. It may also be after the photoresist has been laminated and etched prior to the stripping of the resist.

In an alternate process, the aqueous processible photoresists are laminated onto both sides of a substrate having a polymeric film side and a copper side, using standard laminating techniques. The substrate consists of a polymeric film layer about 12 micrometers to about 125 micrometers thick with the copper layer being from about 12 to about 40 micrometers thick. The photoresist is then exposed on both sides to ultraviolet light or the like, through a suitable mask, crosslinking the exposed portions of the resist. The image is then developed with a dilute aqueous solution until desired patterns are obtained on both sides of the laminate. The copper layer is then etched to obtain circuitry, and portions of the polymeric layer thus exposed. An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the concentrated base at a temperature of from about 70° C. to about 120° C., and the photoresists are then stripped from both sides with a dilute basic solution.

Again, in this process the surface treatment, e.g., plasma or corona treatment can be performed at either of two different times, after initial cleaning of the substrate, prior to the resist being laminated onto the substrate, or after the photoresist has been laminated and etched prior to the stripping of the resist.

Other steps may also be included, such as soaking the film in hot water before or after the etching bath. Acid baths may also be used as a post-etching neutralization.

To create finished products such as flexible circuits, interconnect bonding tape for "TAB" (tape automated bonding) processes, microflex circuits, and the like, further layers may be added and processed, the copper plating may be plated with gold, tin, or nickel for subsequent soldering procedures and the like according to conventional means.

The following examples are meant to be illustrative and are not intended to limit the scope of the invention which is expressed solely by the claims.

EXAMPLES

Examples 1C and 2

A 2 mil polyimide film of Kapton® E, (Ex. 1 C) and an identical sample of Apical® HP (Ex. 2) were prepared under the same conditions. A photoresist was laminated onto the samples followed by standard exposing and developing processes. Both samples were etched at 45% KOH and 195° F. Samples were not rinsed after etching and were examined by cross sectioning to reveal the degree of swelling of the polyimide substrate. Example 1C film showed extensive swelling and pushing up of the resist, which sometimes led to a separation between the polyimide film and resist. Such swelling prevents the etch angle from being easily controlled because the pushing up of the photoresist causes undercut and loss of pattern definition (feature size, sidewall slope angle). Also, swelling of the polyimide can cause a localized delamination of the resist, which can lead to irregular shape due to etchant migration into the delaminated area.

Example 2 film shown very little, if any, swelling. The polyimide dissolved off during etching in comparison with swelling of the comparative polyimide film IC. There is no need for hot water rinsing after chemical etching and the etched through-hole sidewall slope becomes controllable.

Examples 3–4

A polyimide substrate available as Apical® HP was treated by a combination of air corona at 200 W-min/m² and oxygen plasma at 800 nA and 65 mTorr. The film was then chemically etched by 45% potassium hydroxide (KOH) at 200° F. The through-hole features had sidewall slope of about 13 degrees.

A second identical polyimide substrate was chemically etched without treatment and a sidewall slope angle of about 63 degrees was obtained.

Additional samples showed 20–35 degree etched sidewall angle were obtained when air corona treatment was used alone at the power range of 50–200 W-min/m². Etched angles became even shallower with oxygen plasma than air corona. Plasma treatment level and time also showed some effects on the etched angles. Longer time and higher power of treatment normally make etched sidewall angle even shallower at same etching conditions.

Example 5

Altering Via Angle by Adjusting the Etchant Concentration

A polyimide substrate, Apical® HP, was chemically etched using different strength KOH solutions ranging from 40–50% at 200° F. for 60–90 seconds depending on the artwork design. See the following table for resulting etch angle. Etch angles are similar regardless of the artwork design, but depend only on the difference in the etchant concentration.

| KOH Concentration | Resulting Via Angle | |
| --- | --- | --- |
|  | Apical ® HP | Kapton E |
| 40% | 20° ± 5° | 25° ± 5° |
| 45% | 45° ± 5° | 25° ± 5° |
| 50% | 63° ± 5° | 25° ± 5° |

A similar experiment was repeated using Kapton® E film which does not have the same ester functionality along the backbone. The etch concentrations and etch conditions were otherwise the same as those used for the Apical® HP film. The variation of the etch angle due to variation of the KOH concentration was insignificant.

Example 6

Variation in Etch Angle in Samples with an Air Corona Pretreatment

A polyimide substrate, Apical® HP was pretreated by exposure to an air corona at 50, 100, 150, and 200 W-min/m². The film was then etched with a 45% KOH solution at 200° F. for 60–90 seconds depending on the artwork design. The resulting via's sidewall slope was 20°±3°, which is very similar to the angle obtained using the 40 weight percent KOH solution except that there was a significant improvement in the edge definition and a less variation in the actual side wall angle. However, the angle did not vary based on the level of air corona pretreatment applied.

Example 7

Variation in Etch Angle with Air Corona Pretreatment and KOH Concentration

A polyimide substrate, Apical® HP was pretreated by exposure to an air corona at 200 W-min/m². The film was then etched with a 50% KOH solution. The resulting via's side wall slope was 30°±3°. The etched via sidewalls have much better edge definition and less variation in the actual sidewall angle from one sample to another than if KOH etching was done without the pretreatment step.

| KOH Concentration | Pretreatment | Etch Angle | From Example |
| --- | --- | --- | --- |
| 50 w/w % | Air Corona | 30° ± 3° | 7 |
| 45 w/w % | Air Corona | 20° ± 3° | 6 |
| 50 w/w % | No | 63° ± 5° | 5 |

What is claimed is:

1. A flexible circuit having a polyimide substrate containing at least one chemically etched feature, wherein such etched feature has sidewalls having a predetermined slope angle, and wherein said polyimide substrate is made with an imidized film formed from a polyamic acid containing a plurality of ester groups.

2. A flexible circuit according to claim 1 wherein said substrate has been subjected to a surface treatment.

3. A flexible circuit according to claim 1 wherein said polyamic acid contains at least about 25% percent ester groups.

4. A flexible circuit according to claim 3 wherein said polyamic acid is p-phenylene bis(trimellitic acid monoester anhydride) monomer (TMHQ).

5. A flexible circuit according to claim 4 wherein said polyimide substrate was formed a polyamic acid obtained upon the reaction of a p-phenylene bis(trimellitic acid monoester anhydride), hydroxydiphthalic dianhydride, p-phenylenediamine, and 4,4"-diaminodiphenyl ether in an organic solvent.

6. A flexible circuit according to claim 1 wherein said slope angle is between 10 degrees and 75 degrees.

7. A flexible circuit according to claim 6 wherein said angle is between 10 degrees and 60 degrees.

8. A flexible circuit according to claim 1 wherein said polyimide swells less than about 50 percent by volume when subjected to chemical etchants.

9. A flexible circuit according to claim 8 wherein said substrate has been subjected to a surface treatment.

10. A flexible circuit according to claim 1 wherein at least one of said chemically etched feature has at least one sidewall, each sidewall having at least two different predetermined slopes.

11. A flexible circuit according to claim 10 wherein said substrate has been subjected to a surface treatment.

12. A flexible circuit according to claim 11 wherein said surface treatment is selected from the group consisting of gas plasma treatment and corona treatment.

13. A flexible circuit according to claim 1 having multiple chemically etched features.

14. A flexible circuit according to claim 1 wherein said chemically etched feature is a selected from a throughhole and a blind via.

15. A flexible circuit having a polyimide substrate comprising at least a first and a second chemically etched features having sidewalls of predetermined slopes, wherein said predetermine slope of said sidewalls of said first feature differ from the predetermined slope of said sidewalls of said second feature.

16. A flexible circuit according to claim 1 wherein at least one chemically etched feature comprises an opening though the substrate.

17. A flexible circuit according to claim 15 wherein at least one chemically etched feature comprises an opening through the substrate.

* * * * *

UNITED STATES PATENT AND TRADEMARK OFFICE
CERTIFICATE OF CORRECTION

PATENT NO. : 6,611,046 B2
DATED : August 26, 2003
INVENTOR(S) : Yang, Rui

It is certified that error appears in the above-identified patent and that said Letters Patent is hereby corrected as shown below:

Column 1,
Line 36, "be" should read -- been --.

Column 2,
Line 45, "4 aminobenzoate" should read -- 4-aminobenzoate --.

Column 7,
Line 48, "IC" should read -- 1C --.

Column 9,
Line 21, delete "percent".
Line 27, after the word "formed" insert -- from --.

Column 10,
Line 19, delete "a" before the word "selected".
Line 25, "predetermine" should read -- predetermined --.

Signed and Sealed this

Sixth Day of July, 2004

JON W. DUDAS
*Acting Director of the United States Patent and Trademark Office*